United States Patent
Hogan et al.

(10) Patent No.: US 6,878,898 B2
(45) Date of Patent: Apr. 12, 2005

(54) METHOD FOR IMPROVING ASH RATE UNIFORMITY IN PHOTORESIST ASHING PROCESS EQUIPMENT

(75) Inventors: Timothy J. Hogan, Allen, TX (US); Timothy A. Taylor, Sachse, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/635,824

(22) Filed: Aug. 6, 2003

(65) Prior Publication Data

US 2004/0026386 A1 Feb. 12, 2004

Related U.S. Application Data

(62) Division of application No. 09/746,100, filed on Dec. 21, 2000, now Pat. No. 6,646,223.
(60) Provisional application No. 60/173,405, filed on Dec. 28, 1999.

(51) Int. Cl.[7] .............................................. B23K 10/00

(52) U.S. Cl. ............................ 219/121.43; 219/121.41; 156/345.39

(58) Field of Search ........................ 219/121.43, 121.4, 219/121.41, 121.36, 121.42; 156/345.39, 345.26; 118/724, 723 ME, 723 I, 723 IR, 723 MA, 723 MR; 427/562; 250/423 R

(56) References Cited

U.S. PATENT DOCUMENTS

| 4,873,445 | A |   | 10/1989 | Le Jeune |
|---|---|---|---|---|
| 5,248,371 | A |   | 9/1993 | Maher et al. |
| 5,266,146 | A |   | 11/1993 | Ohno et al. |
| 5,453,124 | A | * | 9/1995 | Moslehi et al. ............. 118/715 |
| 5,453,305 | A | * | 9/1995 | Lee ............................. 427/562 |
| 5,781,693 | A | * | 7/1998 | Ballance et al. ............ 392/416 |
| 5,948,283 | A |   | 9/1999 | Grosshart |
| 6,087,615 | A |   | 7/2000 | Schork et al. |
| 6,162,323 | A | * | 12/2000 | Koshimizu ............. 156/345.26 |
| 6,230,650 | B1 |   | 5/2001 | Yamazaki |

* cited by examiner

Primary Examiner—Quang T. Van
(74) Attorney, Agent, or Firm—Charles A. Brill; Wade James Brady, III; Frederick J. Telecky, Jr.

(57) ABSTRACT

A method for improving the edge-to-center photoresist ash rate uniformity in lower temperature (typically, but not limited to <100° C.) processing of integrated circuits and micro-electro-mechanical devices. A varying gap distance 32 from the edge-to-center of the upper and lower grid plates, 30 and 31, of a plasma ashing machine is provided to allow additional flow of plasma gases into the normally semi-stagnated area near the center of the wafer being processed. This improvement overcomes the problem of slower photoresist removal in the center of the wafer. Three configurations of the invention is described, including both stepwise and continuous variation of the grid plate gap spacing and optionally, the variation of the size of grid plate holes in a parallel grid plate assembly.

12 Claims, 5 Drawing Sheets

(Drawing not to scale)

(Drawing not to scale)

(Drawing not to scale)

(Drawing not to scale)

METHOD FOR IMPROVING ASH RATE UNIFORMITY IN PHOTORESIST ASHING PROCESS EQUIPMENT

This application is a divisional and claims priority under 35 USC §119(e)(1) of application Ser. No. 09/746,100 filed Dec. 21, 2000 now U.S. Pat. No. 6,646,223, and provisional application No. 60/173,405 filed Dec. 28, 1999.

BACKGROUND OF THE INVENTION

1. Field of the Invention

This invention relates to semiconductor processing equipment and more particularly to plasma ashing equipment.

2. Description of the Related Art

Certain types of equipment used in the ashing process for the removal of photoresist during the processing of integrated circuits and/or micro-electromechanical-mechanical (MEMS) devices, exhibit an ash rate non-uniformity from the edge-to-center of the wafer. This effect, caused by a semi-stagnation of the plasma gas flow at the center of the wafer as compared to the outer edge of the wafer, results in a decrease in the rate of photoresist removal from the edge to center of the wafer. In the past, this edge-to-center ash rate variation has been minimized by manipulation of several different processing parameters, including pressure, temperature, power, bias direction, and gas concentrations. Typically, these parameters are optimized for a particular process and saved as the process recipe.

Down-streaming plasma reactors often employ grid plates between the plasma generation region and the target wafer. These grid plates are used to ensure that only neutral reactive specie, for example, oxygen and fluorine atoms, make their way to the work piece (target wafer) to ash away the photoresist. Neutral reactive specie minimizes the unwanted side effects; i.e., ion bombardment on CMOS transistors and other component structures. Grid plates are made of metal (example aluminum) with drilled holes to allow the excited gas or plasma to pass though to the target wafer. These plates are positioned such that non direct line-of-sight exist for the gas or plasma to reach the wafer.

A diagram for a down-streaming plasma reactor is shown in FIG. 1a. This type asher employs grid plates 2 and 3, with a separation gap 5, between the plasma generation region and the work piece (wafer). The grid plates consist of metal plates with equal sized holes 6, as shown in FIG. 1b. The upper grid plate 2 and lower grid plate 3 are aligned so there is no direct path for the gases to pass through to the wafer. The plasma gases 1 are applied to the upper grid plate 2 and exit through the holes in the lower grid plate 3. The purpose of the grip plates is to ensure that only neutral reactive specie, such as oxygen and fluorine atoms, make their way to the wafer where the photoresist is to be ashed away. These neutral reactive specie minimize unwanted side effects; i.e., ion bombardment which is destructive to the CMOS transistors and other structures on the wafer. However, as mentioned above, the grid approach can cause stagnation of gases towards the center of the wafer, which cause a faster rate of photoresist removal near the edges of the wafer. This in turn can be destructive to the product being processed.

There is a need to improve the plasma ashing process to better compensate for this non-uniformity in the photoresist removal rate. This variation in ash rate across the wafer is further compounded as wafer size is increased. With 300 mm diameter wafers expected to become the norm in the not too distant future, ash rate uniformity will become even more critical. The invention disclosed herein addresses this need.

U.S. Pat. No. 5,948,283 is an example to one approach to addressing this problem by providing supplemental heat to the wafer in treatment.

SUMMARY OF THE INVENTION

Edge-to-center photoresist ash rate uniformity in the processing of wafers for integrated circuit fabrication and/or micro-electro-mechanical (MEMS) devices can be improved significantly by properly controlling the gap distance or hole size of the grid plates used in plasma ashing process equipment. Specifically, down-streaming plasma ashers that employ grid plates are sensitive to the grid plate separation (gap distance) between grid plates, especially when employed in lower temperature (<100° C. chuck temperature) ashing operations. By providing a continuously variable or stepwise variable gap separation between the grid plates, the ash rate uniformity across the wafer can be improved. Alternatively, variable hole sizes in equal spaced grid plates can be used to accomplish the same results.

This improvement increases the ash (photoresist removal) rate at the center of the target wafer to a point where it is in close proximity to the ash rate near the edges of the wafer. Overall, the improvement of this invention reduces both the process time and the amount of undesirable particle generation, which can damage the product being fabricated.

DETAILED DESCRIPTION

By reducing the variability of the ash rate across the target wafer, shorter process times can be employed, thereby reducing the amount of over-ashing required to compensate for edge-to-center ash rate differences.

Lower temperature (<100° C.) processing is particularly sensitive to manufacturing variations in grid fabrication. As little as 10–15% grid gap distance can swing ash rates as much as 50%. This characteristic allows for the ash rate uniformity to be controlled by variable grid plate separation. The grid plate separation needs to be greater at the center of the wafer in order to compensate for the plasma gas flow differences between the edge-to-center of the wafer. This invention improves the ash rate uniformity by accurately varying the gap spacing between the grid plates. This approach allows for more uniform plasma gas flow and therefore more uniform photoresist removal across the device.

Figure 1A:
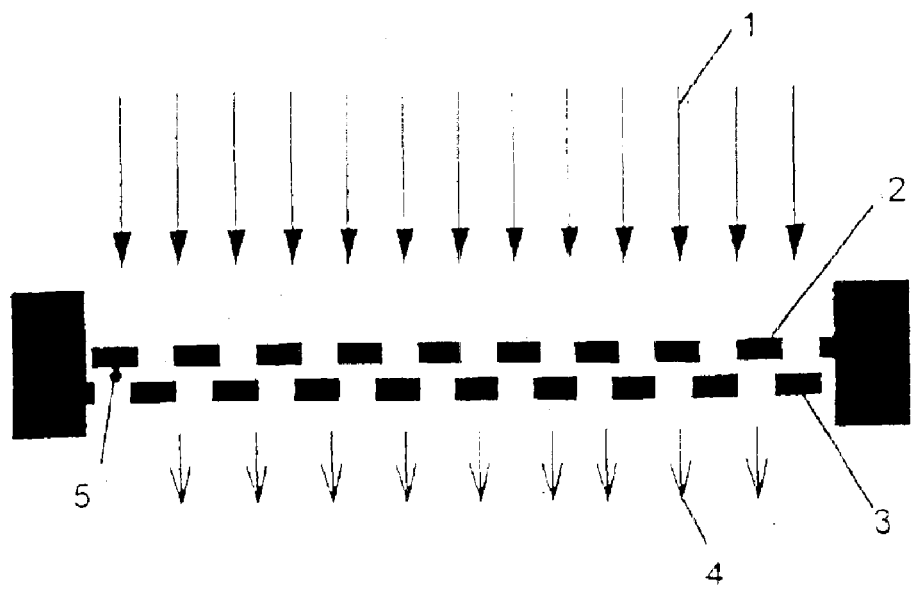
FIGS. 1a and 1b are a schematic and hole pattern layout, respectively, for the grid plates in a typical plasma asher. (prior art)
Figure 1B:
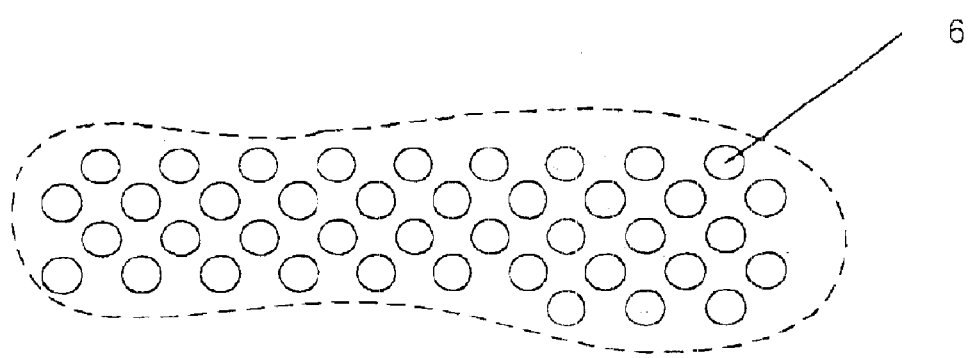
Figure 2A:
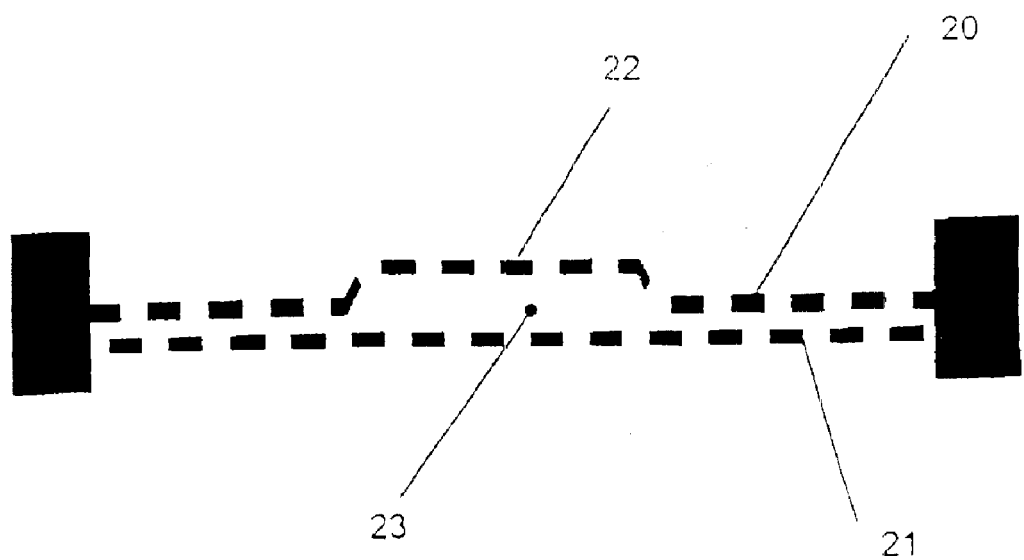
FIGS. 2a and 2b are a schematic and hole pattern layout, respectively, for the stepwise variable gap grid plate separation improvement method of this invention.
Figure 2B:
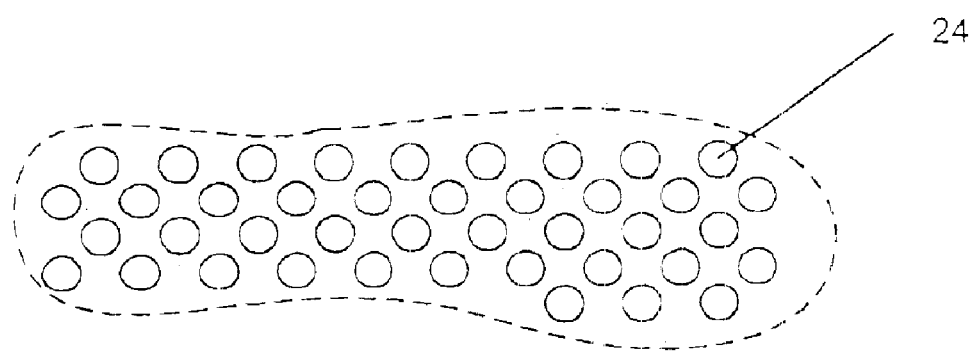

FIG. 2a shows a first embodiment of the invention where the grid plate separation gap is made larger in a stepwise manner over the center region of the target wafer. The grid plates are comprised of an upper plate 20 and a lower plate 21 and are separated by a gap 23. In this case, a stepwise impression 22 is made in the center portion of the upper grid plate 20. This in turn, provides larger gap spacing 23 to be employed over the center of the target wafer. FIG. 2b shows the hole pattern 24, which maintains equal sized holes in the upper and lower grid plates 20 and 21, respectively. Gap spacing typically varies in the neighborhood of 0.035 to 0.050 inches. The wider gap near the center of the grid plates allows greater amounts of plasma gases to flow in this normally semi-stagnated area located around the center of the target wafer.

Figure 3A:
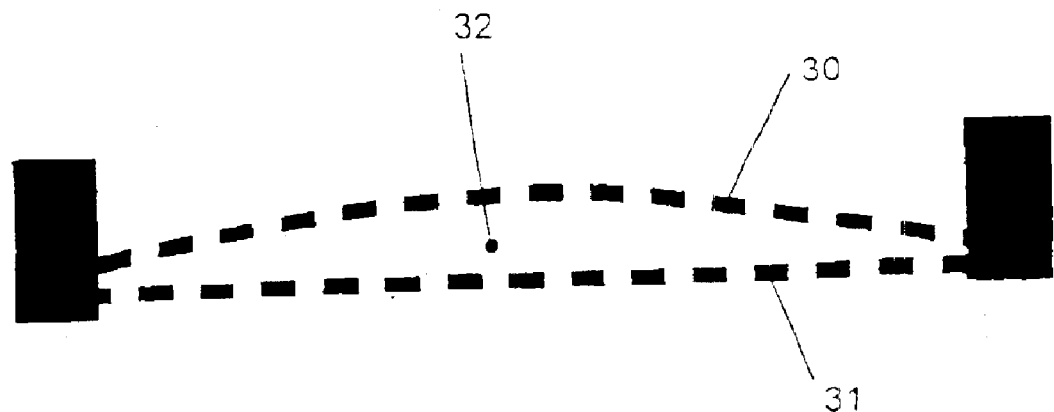
FIGS. 3a and 3b are a schematic and hole pattern layout, respectively, for the continuous variable gap grid plate separation improvement method of this invention.
Figure 3B:
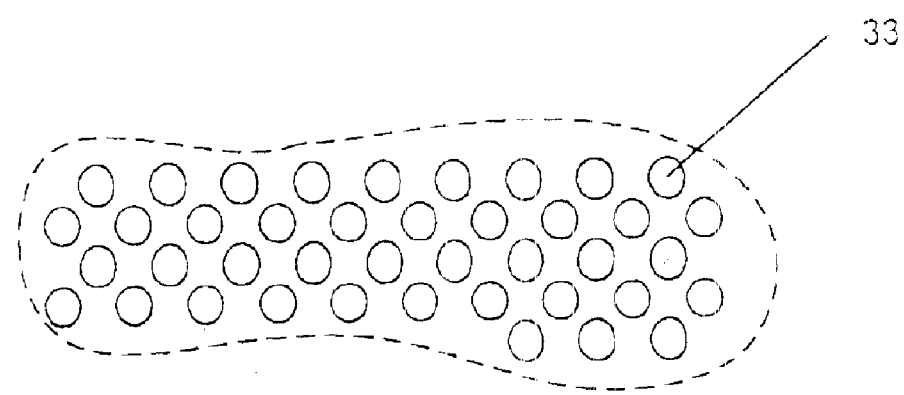

More accurate control of the ash rate uniformity is realized in the second embodiment of this invention, as shown in FIGS. 3a and 3b. Here the gap 32 between upper grid plate 30 and lower grid plate 31 varies continuously from edge-to-center of the grid plate assembly. This eliminates the step function of embodiment one and provides more uniform plasma gas flow over the entire target wafer. As illustrated in FIG. 3b, the grid plate holes 33 are all of equal size. As before, the grid plate gap spacing varies in the range of 0.035 to 0.050 inches.

Figure 4A:
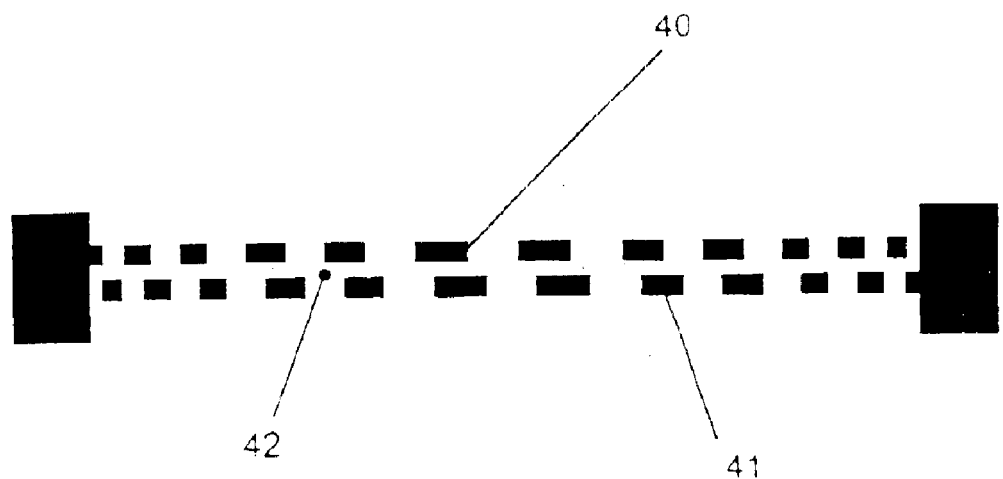
FIGS. 4a and 4b are a schematic and hole pattern layout, respectively, for the variable hole size, equal gap grid plate separation improvement method of this invention.
Figure 4B:
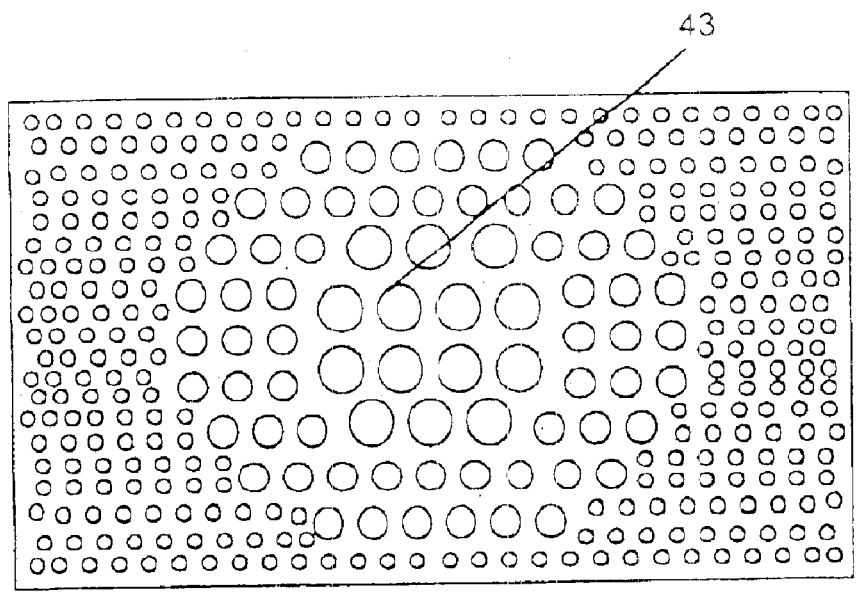

A third embodiment of the invention is depicted in FIGS. 4a and 4b. In this case the grid plates 40 and 41 maintain a constant gap spacing 42, but the hole diameters 43 vary across the plates from edge-to-center, with the larger holes located near the center. The overall effect of this approach is the same as the earlier embodiments in that the plasma gas flow rate is increased in the semi-stagnation area near the center of the target wafer.

Figure 5:
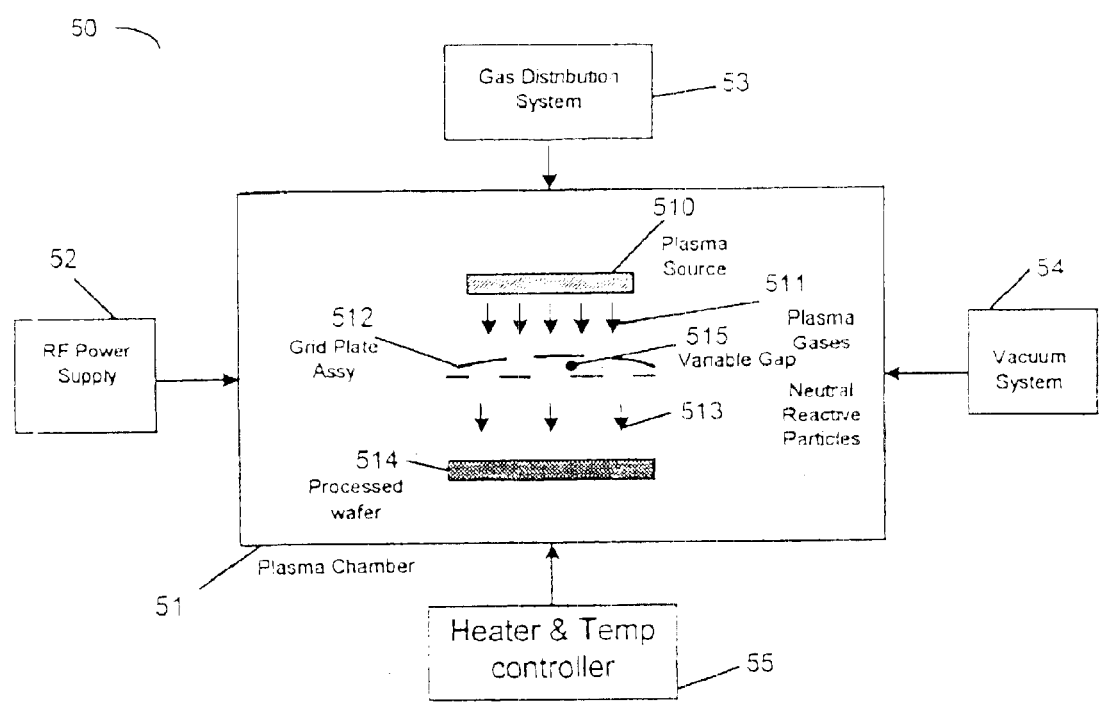
FIG. 5 is a block diagram for a plasma ashing machine, which uses the grid plate assembly of this invention to control ash rate uniformity.

FIG. 5 is a block diagram for a plasma ashing machine 50, which uses the grid plate assembly 512 of this invention. This machine is comprised of a plasma chamber 51 with other necessary sources connected to the chamber, including a RF power supply 52, a gas distribution system 53, a vacuum system 54, and a heater and temperature controller 55. These sources are combined to control the environment inside the plasma chamber 51. The wafer 514 to be processed (work piece) is placed in the plasma chamber 51. Plasma gases 511 from the plasma source 510 are applied to the upper grid plate of the grid plate assembly 512. These gases are neutralized (de-ionized) going through the metal grid plates so that neutral reactive particles 513 exit the lower plate of the grid plate assembly 512. The variable gap 515 between the upper and lower grid plates is made greater from the edge-to-center of the grid plate assembly 512. This variable grid plate gap allows for more of the gases to flow in the center portion of the work piece, overcoming the semi-stagnation which normally occurs in this area and as a result providing faster photoresist removal on the work piece. By controlling this variable gap 515, the ash rate uniformity is controlled, allowing for shorter processing times and higher performing parts since the amount of over etching is considerably reduced.

While this invention has been described in the context of three embodiments, it will be apparent to those skilled in the art that the present invention may be modified in numerous ways and may assume embodiments other than that specifically set out and described above. Accordingly, it is intended by the appended claims to cover all modifications of the invention which fall within the true spirit and scope of the invention.

We claim:

1. A grid plate assembly comprising:

an upper grid plate;

a lower grid plate;

a grid plate gap;

said upper and lower grid plates separated by said gap; wherein said gap between said upper and lower grid plates is larger in a center portion than in a perimeter portion.

2. The grid plate assembly of claim 1, wherein said upper and lower grid plates are made of metal with a series of equal diameter holes; and said upper and lower grid plates are aligned so as to have no direct line-of-sight through said grid plate assembly.

3. The grid plate assembly of claim 2 wherein said grid plate gap separation is made larger in a stepwise manner in the center portion of said grid plate assembly.

4. The grid plate assembly of claim 3 wherein said stepwise gap separation varies in a range of 0.035 to 0.050 inches.

5. The grid plate assembly of claim 2 wherein said grid plate gap separation continuously increases from edge-to-center of said grid plate assembly.

6. The grid plate assembly of claim 5 wherein said stepwise gap separation varies in a range of 0.035 to 0.050 inches.

7. The grid plate assembly of claim 4 or 6 wherein the flow rate uniformity of neutral reactive plasma particles exiting through said lower grid plate is improved by more than 50%.

8. A grid plate assembly comprising:

an upper grid plate;

a lower grid plate;

said upper and lower grid plates separated by a gap;

at least one of said upper and lower grid plates having a series of holes such that holes near the center of said at least one grid plate are larger than holes near the edge of said at least one grid plate.

9. The grid plate assembly of claim 8 wherein said series of variable diameter holes increase in size from edge-to-center of said grid plates.

10. The grid plate assembly of claim 9 wherein said upper and lower grid plates are aligned so as to have no direct line-of-sight through said grid plate assembly.

11. The grid plate assembly of claim 10 wherein said gap between said parallel grid plates vary in a range of 0.035 to 0.050 inches.

12. The grid plate assembly of claim 11 wherein the flow rate uniformity of neutral reactive plasma particles exiting through said lower grid plate is improved by more than 50%.

* * * * *